(12) United States Patent
Heimann et al.

(10) Patent No.: US 8,937,261 B2
(45) Date of Patent: Jan. 20, 2015

(54) OPERATOR CONTROL APPARATUS FOR AN ELECTRICAL HOUSEHOLD APPLIANCE

(75) Inventors: Uwe Heimann, Wangen (DE); Michael Prinz, Leutkirch (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 325 days.

(21) Appl. No.: 13/270,728

(22) Filed: Oct. 11, 2011

(65) Prior Publication Data

US 2012/0112818 A1 May 10, 2012

(30) Foreign Application Priority Data

Oct. 12, 2010 (DE) .......................... 10 2010 048 237

(51) Int. Cl.
| | | |
|---|---|---|
| H01H 1/10 | (2006.01) | |
| F24C 7/08 | (2006.01) | |
| A47L 15/42 | (2006.01) | |
| D06F 39/00 | (2006.01) | |
| H03K 17/96 | (2006.01) | |

(52) U.S. Cl.
CPC .............. *F24C 7/082* (2013.01); *A47L 15/4293* (2013.01); *D06F 39/005* (2013.01); *H03K 17/96* (2013.01); *H03K 2217/96015* (2013.01)
USPC ........................................................ 200/512

(58) Field of Classification Search
USPC ......... 200/512, 517, 257, 284, 292, 295, 296, 200/299, 308, 311, 312, 317, 318, 320, 345, 200/310, 314; 361/761–763, 779, 781; 338/248, 250, 226, 334, 64; 174/257
See application file for complete search history.

(56) References Cited

U.S. PATENT DOCUMENTS

| | | | | |
|---|---|---|---|---|
| 3,757,322 | A * | 9/1973 | Barkan et al. ................. | 345/174 |
| 5,239,152 | A * | 8/1993 | Caldwell et al. .............. | 200/600 |
| 5,810,161 | A * | 9/1998 | Carroll, Jr. .................... | 200/296 |
| 6,667,563 | B2 * | 12/2003 | Bae et al. ....................... | 307/112 |
| 7,355,135 | B2 * | 4/2008 | Rainer et al. .................. | 200/296 |
| 2002/0112942 | A1 * | 8/2002 | Galmiche et al. ............. | 200/5 R |
| 2006/0114128 | A1 | 6/2006 | Prinz et al. | |

(Continued)

FOREIGN PATENT DOCUMENTS

| | | |
|---|---|---|
| DE | 39 09 562 A1 | 9/1990 |
| DE | 200 02 945 U1 | 6/2001 |
| DE | 10 2008 041 517 A1 | 3/2010 |

*Primary Examiner* — Renee Luebke
*Assistant Examiner* — Harshad Patel
(74) *Attorney, Agent, or Firm* — Laurence A. Greenberg; Werner H. Stemer; Ralph E. Locher (57) ABSTRACT

An operator control apparatus for an electrical household appliance has an operator control panel on that side of the operator control apparatus that faces a user and defines an operator control area. A functional assembly is arranged on that face of the operator control panel that is averted from the user. The functional assembly has touch- and/or proximity-sensitive touch-operated switch. The at least one touch-operated switch of the functional assembly is positioned so as to correspond to operator control area of the operator control panel. A connecting apparatus is permanently connected to the operator control panel and releasably connected to the functional assembly, or in the alternative it is permanently connected to the functional assembly while it is releasably connected to the operator control panel. In this way, the functional assembly is releasably attached to the operator control panel but without play.

16 Claims, 5 Drawing Sheets

(56) References Cited

U.S. PATENT DOCUMENTS

| | | | |
|---|---|---|---|
| 2008/0128250 A1* | 6/2008 | Shen et al. | 200/314 |
| 2009/0107829 A1* | 4/2009 | Heimann | 200/600 |
| 2009/0108985 A1* | 4/2009 | Haag et al. | 338/248 |
| 2011/0036692 A1* | 2/2011 | Yuasa | 200/295 |

* cited by examiner

OPERATOR CONTROL APPARATUS FOR AN ELECTRICAL HOUSEHOLD APPLIANCE

CROSS-REFERENCE TO RELATED APPLICATION

This application claims the priority, under 35 U.S.C. §119, of German patent application DE 10 2010 048 237.4-34, filed Oct. 12, 2010; the prior application is herewith incorporated by reference in its entirety.

BACKGROUND OF THE INVENTION

Field of the Invention

The present invention relates to an operator control apparatus for an electrical household appliance. The apparatus has an operator control panel which is arranged on that side of the operator control apparatus that faces a user and which defines at least one operator control area. A functional assembly which is arranged on that face of the operator control panel that is averted from the user and which has at least one touch-sensitive and/or proximity-sensitive touch-operated switch. The at least one touch-operated switch of the functional assembly is positioned so as to correspond to the at least one operator control area of the operator control panel.

Operator control apparatuses for electrical household appliances or domestic appliances such as cooktops, stoves, ovens, cookers, microwave ovens, dishwashers, washing machines, tumble dryers, washer dryers and the like are increasingly being equipped with touch- and/or proximity-sensitive touch-operated switches. The following technologies, in particular, are known for touch-operated switches of this kind: capacitive sensors, inductive sensors, piezoelectric sensors and sensors having strain gauges.

The technology which is to be used for the touch-operated switches is selected, among other things, as a function of the properties of the operator control panel of the operator control apparatus. In the case of electrically non-conductive operator control panels, for example which are composed of plastic, glass or glass-ceramic, the capacitive sensor presents a simple and cost-effective solution in many cases.

All four of the technologies can be used in the case of electrically conductive operator control panels which are composed, for example, of metal (for example stainless steel). In this case, each of these technologies is designated pressure-sensitive since it requires a small movement travel—localized on the touch-operation region or the operator control area—on the operator control panel for touch operation. This movement travel leads to an immediate change in the electrical sensor signal in inductive and capacitive sensors, the change being identified by evaluation electronics. In the case of piezoelectric sensors and sensors based on strain gauges, a force is exerted on the sensor element by means of a movement travel of this kind. This force effect is detected by the respective sensor element, converted into an electrical sensor signal and evaluated by the evaluation electronics for the purpose of identifying touch operation Exact detection of small movement travels of this kind requires a very compact and rigid assembly for the entire operator control apparatus together with a relatively high degree of local elasticity—which is restricted only to the respective individual operator control areas. This object is conventionally achieved in that a multilayer assembly is selected, in the case of which the operator control panel, the touch-sensitive touch-operated switch which is in the form of, for example, a sensor film, and a supporting plate are permanently connected to one another by means of adhesive layers in as rigid a manner as possible. The adhesive bonding in the region of the touch-operated switch, of course, is thereby omitted. This produces a stable assembly comprising an operator control panel and a functional assembly which can be installed in an electrical household appliance as a unit. Disadvantages of a composite construction of this kind include the complicated adhesive bonding processes and the need to replace the entire operator control apparatus, including the operator control panel and the functional assembly, if repairs are necessary.

SUMMARY OF THE INVENTION

It is accordingly an object of the invention to provide an operator control apparatus for an electrical appliance which overcomes the above-mentioned disadvantages of the heretofore-known devices and methods of this general type and which provides for an operator control apparatus with touch-sensitive and/or proximity-sensitive touch-operated switches that is simple in its design and construction, yet is highly reliable in functional terms.

With the foregoing and other objects in view there is provided, in accordance with the invention, an operator control apparatus for an electrical household appliance, comprising:

an operator control panel arranged on a side of the operator control apparatus intended to face a user and being formed with at least one operator control area;

a connecting apparatus mounted to and permanently connected with the operator control panel; and a functional assembly arranged on a side of the operator control panel to be averted from the user, the functional assembly being releasably attached to the connecting apparatus and thereby releasably connected to the operator control panel without play; and the functional assembly having at least one touch- and/or proximity-sensitive touch-operated switch disposed in alignment and in correspondence with the at least one operator control area of the operator control panel.

In an alternative embodiment of the invention, the connecting apparatus is permanently connected to the functional assembly while it is releasably connected with the operator control panel. This also results in the fact that the operator control panel is releasably connected with the functional assembly.

According to the first aspect of the invention, the operator control apparatus for an electrical household appliance comprises an operator control panel which is arranged on that side of the operator control apparatus that faces a user and which defines at least one operator control area; and a functional assembly which is arranged on that face of the operator control panel that is averted from the user and which has at least one touch- and/or proximity-sensitive touch-operated switch, with the at least one touch-operated switch of the functional assembly being positioned so as to correspond to the at least one operator control area of the operator control panel, and, according to the invention, is characterized in that a connecting apparatus is provided, this connecting apparatus being permanently connected to the operator control panel; and the functional assembly is releasably attached to the connecting apparatus in such a way that it is connected to the operator control panel in a releasable manner and without play.

Instead of a non-releasable overall composite assembly comprising the operator control panel and the functional apparatus, the invention proposes connecting the components operator control panel and functional assembly to one another in a releasable manner. To this end, a connecting apparatus is connected between the components, the connecting apparatus firstly being permanently connected to the operator control panel and secondly allowing releasable attachment of the functional assembly.

While the operator control apparatus can continue to be mounted in an electrical household appliance as a standard unit, production of the operator control apparatus itself is simplified since fewer complicated adhesive connections have to be made. In addition, the entire operator control apparatus does not have to be replaced if repairs are necessary, but rather it suffices to replace the respectively defective component from amongst the operator control panel and the functional assembly.

The design according to the invention is advantageous particularly in the case of operator control apparatuses having electrically conductive operator control panels in which a compact and rigid structure of the operator control apparatus is required for reliable detection of a movement travel. For this reason, the connecting apparatus has to be designed in such a way that it ensures a releasable, but at the same time play-free, connection between the functional assembly and the operator control panel. This property should also apply as far as possible in the case of manufacturing tolerances, temperature changes and aging influences.

The operator control apparatus according to the invention can advantageously be used in electrical household appliances such as hobs, cookers, microwave ovens, dishwashers, washing machines, tumble dryers, washer dryers and the like, for example.

The "touch-sensitive and/or proximity-sensitive touch-operated switches" usually contain capacitive sensors, inductive sensors, piezoelectric sensors and sensors which are based on strain gauges. However, the invention is not restricted to these embodiments of touch-operated switches. Optical sensors can also be used, for example.

The "permanent connection" between the connecting apparatus and the operator control panel is established, for example, by an adhesive or soldered connection. It is also possible to form the connecting apparatus integrally with the operator control panel.

The term "releasably connected" and the "releasable connection" between the functional assembly and the operator control panel is to be understood to mean connections which can be released, substantially without being destroyed, with or without a tool.

According to a second aspect of the invention, the above and other objects are also achieved by an operator control apparatus for an electrical household appliance, which operator control apparatus comprises an operator control panel which is arranged on that side of the operator control apparatus that faces a user and which defines at least one operator control area; and a functional assembly which is arranged on that face of the operator control panel that is averted from the user and which has at least one touch- and/or proximity-sensitive touch-operated switch, with the at least one touch-operated switch of the functional assembly being positioned so as to correspond to the at least one operator control area of the operator control panel, and is characterized in that a connecting apparatus is provided, this connecting apparatus being permanently connected to the functional assembly; and in that the operator control panel is releasably attached to the connecting apparatus in such a way that it is connected to the functional assembly in a releasable manner and without play.

A releasable connection between the components operator control panel and functional assembly instead of a non-releasable overall composite assembly comprising the operator control panel and the functional assembly is proposed in the case of this design too. To this end, a connecting apparatus is again connected between the said components, the said connecting apparatus firstly being permanently connected to the functional assembly and secondly allowing releasable attachment of the operator control panel in this case.

In other words, the second aspect of the invention is a reverse of the first aspect with regard to the realization of the two-stage, completely releasable connection between the operator control panel and the functional assembly, with the interposition of the connecting apparatus. It goes without saying that the above observations regarding the first aspect of the invention therefore correspondingly apply to this second aspect of the invention too.

In a refinement of the invention, the connecting apparatus has a large number of attachment elements for releasably attaching the functional assembly or the operator control panel to the connecting apparatus. The provision of a large number of attachment elements can result in uniform distribution of force over the attachment means, this in turn being advantageous for the purpose of establishing a play-free connection between the functional assembly and the operator control panel.

The releasable connection of the functional assembly to the operator control panel is, for example, selected from among latching connections, snap-action connections, clamping connections, joggle connections, screw connections and combinations of these types of connectors.

In a further refinement of the invention, the functional assembly is elastically prestressed against the operator control panel by the connecting apparatus. As a result, a play-free connection between the functional assembly and the operator control panel can be better ensured in the case of manufacturing tolerances, temperature influences and aging phenomena too.

In accordance with a further feature of the invention, the at least one touch-operated switch can be designed, for example, in the form of a sensor film or the like. In this refinement, a plurality of touch-operated switches can also be configured in the form of a common sensor film. These refinements permit a very compact design of the functional assembly and therefore of the entire operator control apparatus.

In a refinement of the invention, the functional assembly also has a support for the at least one touch-operated switch. The use of a support of this kind can increase the stability of the functional assembly and therefore likewise contribute to the play-free connection between the functional assembly and the operator control panel.

In the last-mentioned embodiment, this support of the functional assembly is preferably releasably attached to the connecting apparatus (in the case of the first aspect of the invention) or serves for permanent connection to the connecting apparatus (in the case of the second aspect of the invention).

In accordance with a concomitant feature of the invention, the functional assembly is provided with at least one indicator element. In this case, the operator control panel can also have at least one transparent indicator area which is positioned so as to correspond with the at least one indicator element of the functional assembly, and the functional assembly can also have at least one light guide element which is arranged between the at least one indicator element of the functional assembly and the at least one indicator area of the operator control panel.

Other features which are considered as characteristic for the invention are set forth in the appended claims.

Although the invention is illustrated and described herein as embodied in an operator control apparatus for an electrical household appliance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

A preferred exemplary embodiment of the operator control apparatus that corresponds to a first aspect of the invention will now be described with reference to FIGS. 1 to 6. Those of skill in the pertinent art will be able to identify a variation thereof, namely, an embodiment for an operator control apparatus according to a second aspect of the claimed invention.

Figure 1:
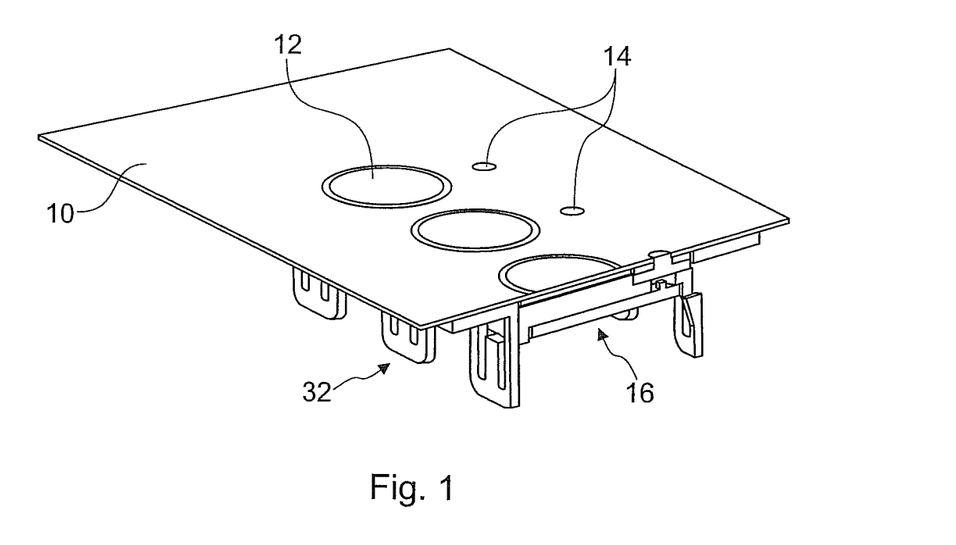
FIG. 1 shows a perspective view (partially in section) from the view of the user of a preferred embodiment of an operator control apparatus according to the invention.
Figure 2:
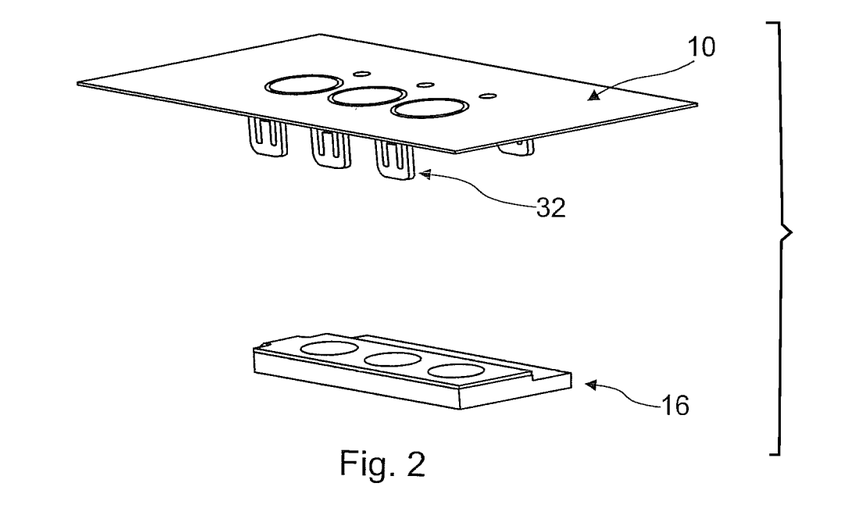
FIG. 2 shows an exploded perspective view of the two assemblies which are to be releasably connected according to a preferred exemplary embodiment of an operator control apparatus of the invention.

Referring now to the figures of the drawing in detail and first, particularly, to FIG. 1 thereof, there is shown an operator control apparatus with an operator control panel 10 which is composed of an electrically non-conductive material (for example plastic, glass, glass-ceramic) or an electrically conductive material (for example metal, such as stainless steel). A plurality of operator control areas 12 are identified (for example optically and/or haptically) for the user in this operator control panel 10. In addition to these operator control areas 12, a plurality of transparent indicator areas 14 are optionally provided too, it being possible for the indicator areas to be in the form of apertures or to be formed from a transparent material. The operator control panel 10 has a substantially closed surface—apart from possibly in the transparent indicator areas 14. That is to say, the operator control areas 12 also each have a substantially closed surface.

A functional assembly 16 is arranged on that face of the operator control panel which is averted from the user. As explained in greater detail further below, this functional assembly 16 contains a plurality of touch- and/or proximity-sensitive touch-operated switches 21 and optionally a plurality of indicator elements 26 which, in terms of number and positioning, correspond to the operator control areas 12 and indicator areas 14, respectively, of the operator control panel 10.

In the manufacturing process, this functional assembly 16 forms an independent assembly which is releasably connected to the operator control panel 10. A connecting apparatus 32 is provided for this purpose, the said connecting apparatus being arranged between the operator control panel 10 and the functional assembly 16. This connecting apparatus 32 is permanently connected, for example by adhesive bonding, to that face of the operator control panel 10 which is averted from the user and therefore likewise forms an independent assembly in the manufacturing process.

Figure 3:
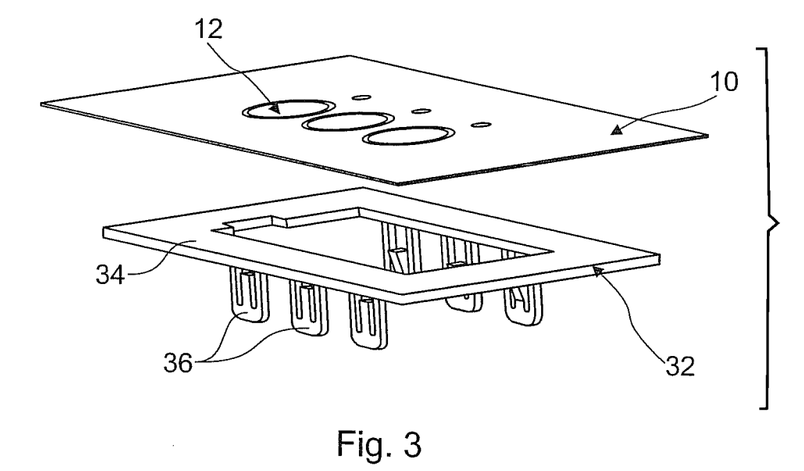
FIG. 3 shows an exploded perspective view of the assembly of the operator control apparatus from FIG. 2, which assembly comprises the operator control panel and the connecting apparatus.
Figure 4:
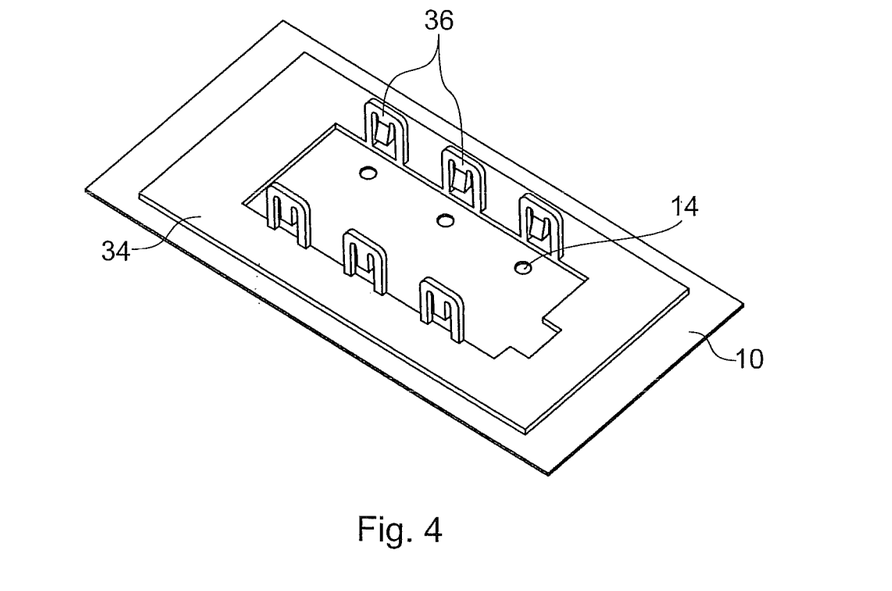
FIG. 4 shows a perspective view of the assembled assembly from FIG. 3 from the direction of the face which is averted from the user.

As shown in FIGS. 3 and 4 in particular, this connecting apparatus 32 is constructed, by way of example, from a flat frame 34 which is adhesively bonded to the operator control panel 10. A plurality of attachment elements 36 project from this frame 34 in the direction of the functional assembly 16. In this exemplary embodiment, these attachment elements 36 are designed for releasable attachment to the functional assembly 16 in the manner of a latching or snap-action connection.

The unit comprising the operator control panel 10 and the functional assembly 16, which unit is assembled in the manufacturing process, can then be installed in an electrical household appliance as a structural component.

Figure 5:
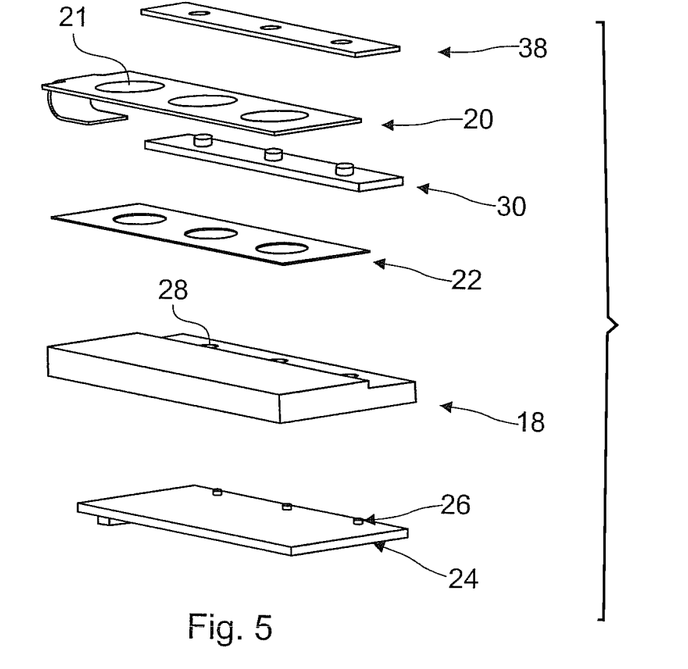
FIG. 5 shows an exploded perspective view of the functional assembly of the operator control apparatus from FIG. 2.

As shown in FIG. 5, the functional assembly 16 contains a support 18 for inherently stabilizing the functional assembly 16. A sensor film 20 having a plurality of touch-operated switches 21 is mounted on that face of the support 18 that faces the operator control panel 10 by means of an adhesive film 22. These touch-operated switches 21 are in the form of touch- and/or proximity-sensitive switches and contain, for example, capacitive sensors, inductive sensors, piezoelectric sensors or sensors having strain gauges.

A printed circuit board 24 is arranged on that face of the support 18 which is averted from the operator control panel 10, the said printed circuit board being connected to the sensor film 20 or the touch-operated switches 21 of the said sensor film. The printed circuit board 24 can selectively serve only for further connection of the sensor film 20 to evaluation electronics or itself contain the evaluation electronics for the touch-operated switches 21. Furthermore, it is also possible for the printed circuit board 18 to contain both the evaluation electronics for the touch-operated switches 21 and also at least some of the control electronics for the electrical household appliance.

Figure 6:
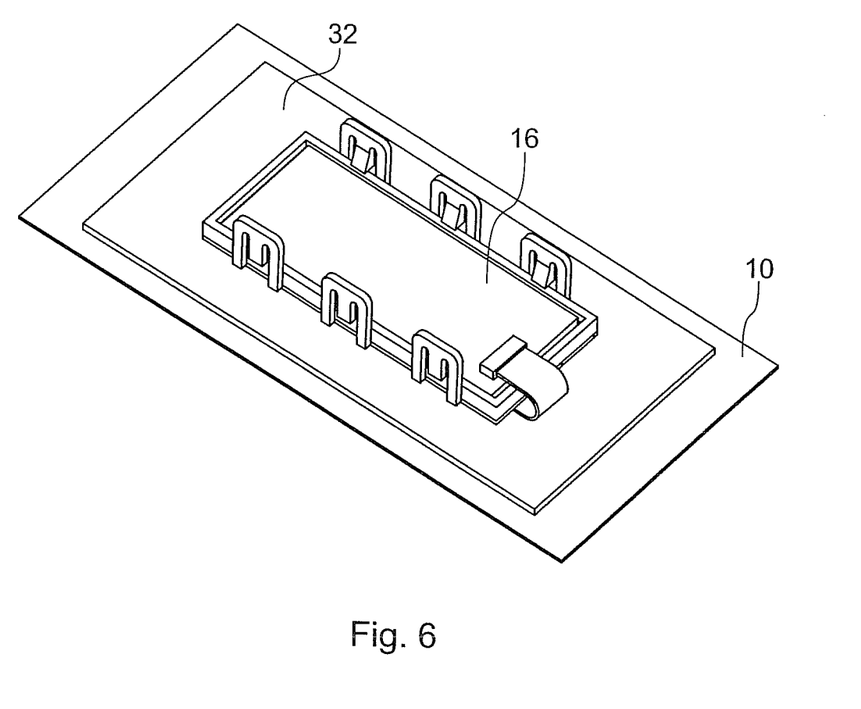
FIG. 6 shows a perspective view of the assembled operator control apparatus from FIG. 2 from the direction of the face which is averted from the user.
Figure 7:
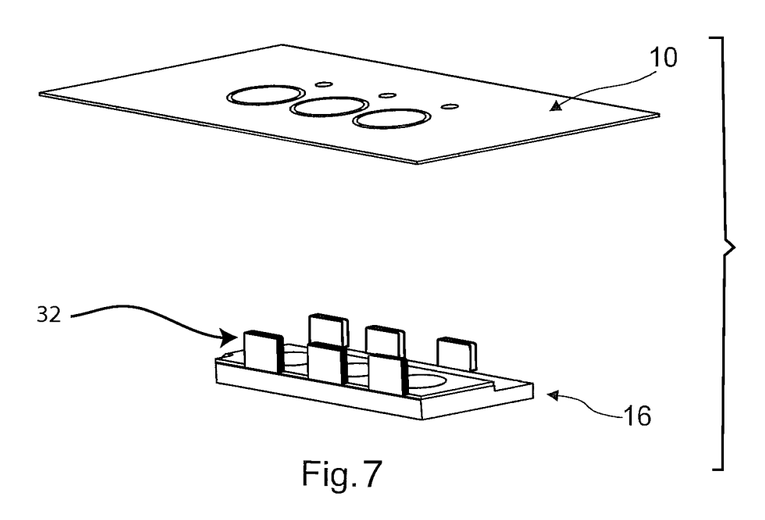
FIG. 7 shows an exploded perspective view of the two assemblies which are to be releasably connected according to a preferred exemplary embodiment of an operator control apparatus of the invention.

As can be seen in FIGS. 1 and 6, the attachment elements 36 of the connecting apparatus 32 engage behind the support 18 and the printed circuit board 24 of the functional assembly 16, and therefore the functional assembly 16 and, in particular, the touch-operated switches 21 of the said functional assembly are connected to the operator control panel 10 in a releasable manner and, at the same time, without play.

In this case, the connecting apparatus 32 is designed in such a way that manufacturing tolerances, temperature changes, ageing influences and the like are compensated for and complete freedom from play is ensured. The functional assembly 16 has, overall, a high degree of mechanical stiffness and, at the same time, local compliance in the region of the touch-operated switches; the entire operator control apparatus likewise has a degree of mechanical stiffness with partial local compliance in the region of the operator control areas 12 and touch-operated switches 21.

In addition, the connecting apparatus 32 is designed such that the minimum movement travel in the operator control area 12 of the operator control panel 10, which movement travel takes place in the event of operation of a key, is identified by the touch-operated switch 21 as an operating signal. In the case of a capacitive or inductive touch-operated switch 21, a movement travel of this kind is directly identified by the touch-operated switch 21; in the case of piezoelectric touch-operated switches or touch-operated switches which are based on strain gauges, a force is exerted on the touch-operated switch 21 by means of the movement travel and this force effect causes a signal to be transmitted in the touch-operated switch 21.

As mentioned, the operator control panel 10 can optionally be provided with transparent indicator areas 14, in addition to the operator control areas 12. In this case, the functional assembly 16 likewise optionally contains a plurality of indicator elements, for example in the form of light-emitting diodes 26 or displays.

As illustrated in FIG. 5, these light-emitting diodes 26 are arranged on the printed circuit board 24 of the functional assembly 16, and the support 18 is provided with corresponding apertures 28. In order to reduce radiation losses, a light guide element 30 is optionally additionally provided between the light-emitting diodes 26 and the indicator areas 14 of the operator control panel 10, it being possible for the light guide element to be adhesively bonded to the rear face of the operator control panel 10 by way of a further adhesive film 38, for example.

The invention claimed is:

1. An operator control apparatus for an electrical household appliance, comprising:
    an operator control panel arranged on a side of the operator control apparatus intended to face a user and said operator control panel having a surface being formed with at least one operator control area, said surface of said operator control panel being closed at said operator control area;
    a connecting apparatus mounted to and permanently connected with said operator control panel said connecting apparatus having a face that is permanently connected onto a face of said operator control panel to be averted from the user; and
    a functional assembly arranged on a side of the operator control panel to be averted from the user, said functional assembly being releasably attached to said connecting apparatus and thereby releasably connected to said operator control panel without play; and
    said functional assembly having at least one touch- and/or proximity-sensitive touch-operated switch disposed in alignment and in correspondence with said at least one operator control area of said operator control panel, said at least one touch-operated switch including a sensor film, said functional assembly including a support having a planar face, said sensor film being mounted on said planar face with an adhesive film.

2. The operator control apparatus according to claim 1, wherein said connecting apparatus has a multiplicity of attachment elements for releasably attaching said functional assembly to said connecting apparatus.

3. The operator control apparatus according to claim 1, wherein said releasable connection of said functional assembly to said operator control panel is selected from the group of connectors consisting of latching connections, snap-action connections, clamping connections, joggle connections, screw connections, and combinations thereof.

4. The operator control apparatus according to claim 1, wherein said connecting apparatus is configured to elastically prestress said functional assembly against said operator control panel.

5. The operator control apparatus according to claim 1, wherein said functional assembly further includes at least one indicator element.

6. The operator control apparatus according to claim 5, wherein said operator control panel has at least one transparent indicator area positioned so as to correspond to said at least one indicator element of said functional assembly.

7. The operator control apparatus according to claim 5, wherein said functional assembly further includes at least one light guide element disposed between said at least one indicator element of said functional assembly and said at least one indicator area of said operator control panel.

8. The operator control apparatus according to claim 1, wherein said functional assembly further includes a printed circuit board mounted on a face of said support averted from said operator control panel.

9. An operator control apparatus for an electrical household appliance, comprising:
    an operator control panel arranged on a side of the operator control apparatus intended to face a user and said operator control panel having a surface being formed with at least one operator control area, said surface of said operator control panel being closed at said operator control area;
    a functional assembly arranged on a side of the operator control panel to be averted from the user;
    a connecting apparatus permanently connected to said functional assembly; and
    said operator control panel being releasably attached to said connecting apparatus and thereby connected to said functional assembly releasably and without play; and
    said functional assembly having at least one touch- and/or proximity-sensitive touch-operated switch disposed in alignment and in correspondence with said at least one operator control area of said operator control panel, said at least one touch-operated switch including a sensor film, said functional assembly including a support having a planar face, said sensor film being mounted on said planar face with an adhesive film.

10. The operator control apparatus according to claim 9, wherein said connecting apparatus has a multiplicity of attachment elements for releasably attaching said operator control panel to said connecting apparatus.

11. The operator control apparatus according to claim 9, wherein said connecting apparatus is configured to elastically prestress said functional assembly against said operator control panel.

12. The operator control apparatus according to claim 9, wherein said releasable connection of said functional assembly to said operator control panel is selected from the group of connectors consisting of latching connections, snap-action connections, clamping connections, joggle connections, screw connections, and combinations thereof.

13. The operator control apparatus according to claim 9, wherein said functional assembly further includes at least one indicator element.

14. The operator control apparatus according to claim 13, wherein said operator control panel has at least one transparent indicator area positioned so as to correspond to said at least one indicator element of said functional assembly.

15. The operator control apparatus according to claim 14, wherein said functional assembly further includes at least one light guide element disposed between said at least one indicator element of said functional assembly and said at least one indicator area of said operator control panel.

16. The operator control apparatus according to claim 9, wherein said functional assembly further includes a printed circuit board mounted on a face of said support averted from said operator control panel.

\* \* \* \* \*